(12) United States Patent
Maeda et al.

(10) Patent No.: US 9,188,855 B2
(45) Date of Patent: Nov. 17, 2015

(54) IMPRINT APPARATUS, IMPRINT METHOD, AND DEVICE MANUFACTURING METHOD

(75) Inventors: Hironori Maeda, Utsunomiya (JP);
Seiya Miura, Utsunomiya (JP);
Kazuhiko Mishima, Utsunomiya (JP);
Ken Minoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 293 days.

(21) Appl. No.: 13/469,829

(22) Filed: May 11, 2012

(65) Prior Publication Data
US 2012/0292801 A1 Nov. 22, 2012

(30) Foreign Application Priority Data
May 17, 2011 (JP) ................................ 2011-110587

(51) Int. Cl.
*B29C 59/02* (2006.01)
*G03F 7/00* (2006.01)
*G03F 9/00* (2006.01)
*B82Y 10/00* (2011.01)
*B82Y 40/00* (2011.01)

(52) U.S. Cl.
CPC .............. *G03F 7/0002* (2013.01); *B82Y 10/00* (2013.01); *B82Y 40/00* (2013.01); *G03F 9/7042* (2013.01); *G03F 9/7088* (2013.01)

(58) Field of Classification Search
CPC ...... B29C 59/002; B29C 59/00; B29C 43/00; B29C 43/58; B29C 43/32
USPC .......... 264/293, 40.5, 447, 1.1; 425/169, 150, 425/385, 135, 174.4
See application file for complete search history.

(56) References Cited

U.S. PATENT DOCUMENTS

| | | | | |
|---|---|---|---|---|
| 4,780,616 A | * | 10/1988 | Nishi et al. | 250/548 |
| 5,966,216 A | * | 10/1999 | Galburt et al. | 356/401 |
| 6,154,281 A | * | 11/2000 | Sentoku et al. | 356/401 |
| 6,727,980 B2 | * | 4/2004 | Ota et al. | 355/55 |
| 2003/0164933 A1 | * | 9/2003 | Nishi et al. | 355/67 |
| 2005/0212156 A1 | | 9/2005 | Tokita et al. | |
| 2007/0058164 A1 | * | 3/2007 | Shibata et al. | 356/237.2 |
| 2007/0183054 A1 | * | 8/2007 | Ryzhikov et al. | 359/619 |
| 2008/0259421 A1 | * | 10/2008 | Curtis et al. | 359/21 |

(Continued)

FOREIGN PATENT DOCUMENTS

| | | |
|---|---|---|
| CN | 1936711 A | 3/2007 |
| CN | 101281378 A | 10/2008 |
| CN | 101576714 A | 11/2009 |
| CN | 102053490 A | 5/2011 |
| JP | H02-191314 A | 7/1990 |
| JP | 2005-286062 A | 10/2005 |

(Continued)

*Primary Examiner* — Joseph S del Sole
*Assistant Examiner* — Nahida Sultana
(74) *Attorney, Agent, or Firm* — Canon USA, Inc. IP Division

(57) ABSTRACT

An imprint apparatus, which is configured to transfer a pattern to an imprint material supplied on a substrate by using a mold having the pattern formed thereon, includes a light-receiving element, a detection system configured to illuminate a mark formed on the substrate and a mark formed on the mold, and guide light reflected from the mark formed on the substrate and the mark formed on the mold to the light-receiving element, and a relay optical system. The relay optical system is configured to form images of the light reflected from the mark formed on the substrate and the mark formed on the mold between the relay optical system and the detection system. The detection system is configured to guide the light image-formed by the relay optical system to the light-receiving element.

25 Claims, 16 Drawing Sheets

(56) References Cited

U.S. PATENT DOCUMENTS

| | | | |
|---|---|---|---|
| 2009/0108483 A1* | 4/2009 | Suehira et al. | 264/40.5 |
| 2011/0076352 A1 | 3/2011 | Den Boef et al. | |
| 2012/0193602 A1* | 8/2012 | Lieber et al. | 257/5 |
| 2014/0043591 A1* | 2/2014 | Kurashige et al. | 353/85 |
| 2015/0014892 A1* | 1/2015 | Shinoda | 264/447 |

FOREIGN PATENT DOCUMENTS

| | | |
|---|---|---|
| JP | 2008-221822 A | 9/2008 |
| JP | 2010-067969 A | 3/2010 |
| JP | 2010-183075 A | 8/2010 |
| KR | 10-2008-0053503 A | 6/2008 |
| KR | 10-2009-0009874 A | 1/2009 |

* cited by examiner

IMPRINT APPARATUS, IMPRINT METHOD, AND DEVICE MANUFACTURING METHOD

BACKGROUND OF THE INVENTION

1. Field of the Invention

One disclosed aspect of the embodiments relates to a mark detection system in an imprint apparatus configured to transfer a pattern of a mold onto an imprint material on a substrate.

2. Description of the Related Art

An imprint technique is a technique for bringing a minute pattern formed on a mold and an imprint material supplied on a substrate into contact with each other (imprinting the pattern) to thereby form the pattern.

An optical imprint method will be described now as one example of the imprint technique. First, a layer constituted by photo curable resin (hereinafter referred to as "imprint resin") is formed on a substrate (for example, a semiconductor wafer). Subsequently, the imprint resin and a mold with a desired minute uneven structure (pattern) formed thereon are brought into contact with each other. Subsequently, while the imprint resin and the mold are kept in contact with each other, the imprint resin is cured by be irradiated with ultraviolet light. After the imprint resin is cured, the imprint resin and the mold are separated from each other, thereby forming the pattern on the substrate.

An imprint apparatus performs alignment for each shot before bringing the mold and the imprint resin into contact with each other. The alignment of the imprint apparatus is realized by using a through-the-mold detection system (hereinafter referred to as "TTM detection system"), which may perform alignment by simultaneously detecting marks formed on the mold and the wafer. Japanese Patent Application Laid-Open No. 2005-286062 discusses an imprint apparatus in which an illumination system for irradiating a resin layer with ultraviolet light is arranged above a mold, and a TTM detection system is arranged in such a manner that the TTM detection system gets out of the way of the illumination system.

It is required to arrange the TTM detection system to be inclined relative to an optical axis of the illumination system to prevent the TTM detection system from interfering with the illumination system and a illumination light flux. To enable wafer alignment by the TTM detection system arranged to be inclined relative to the optical axis of the illumination system, the TTM detection system is arranged according to the Littrow arrangement, and detects a signal by acquiring light diffracted at a Littrow angle. However, the TTM detection system arranged according to the Littrow arrangement cannot have a sufficiently large detection numerical aperture (hereinafter referred to as "NA") of the TTM detection system for the configurational limitation, leading to a problem of a reduction in the detection light amount, thereby resulting in low alignment accuracy.

SUMMARY OF THE INVENTION

One disclosed aspect of the embodiments is directed to an improvement of accuracy of alignment between a substrate and a mold by increasing a detection numerical aperture of a TTM detection system.

According to an aspect of the embodiments, an imprint apparatus, which is configured to transfer a pattern to an imprint material supplied on a substrate by using a mold having the pattern formed thereon, includes a light-receiving element, a detection system configured to illuminate a mark formed on the substrate and a mark formed on the mold, and guide light reflected from the mark formed on the substrate and the mark formed on the mold to the light-receiving element, and a relay optical system. The relay optical system is configured to form images of the light reflected from the mark formed on the substrate and the mark formed on the mold between the relay optical system and the detection system. The detection system is configured to guide the light imaged by the relay optical system to the light-receiving element.

Further features and aspects of the disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the embodiments and, together with the description, serve to explain the principles of the disclosure.

DESCRIPTION OF THE EMBODIMENTS

Figure 1:
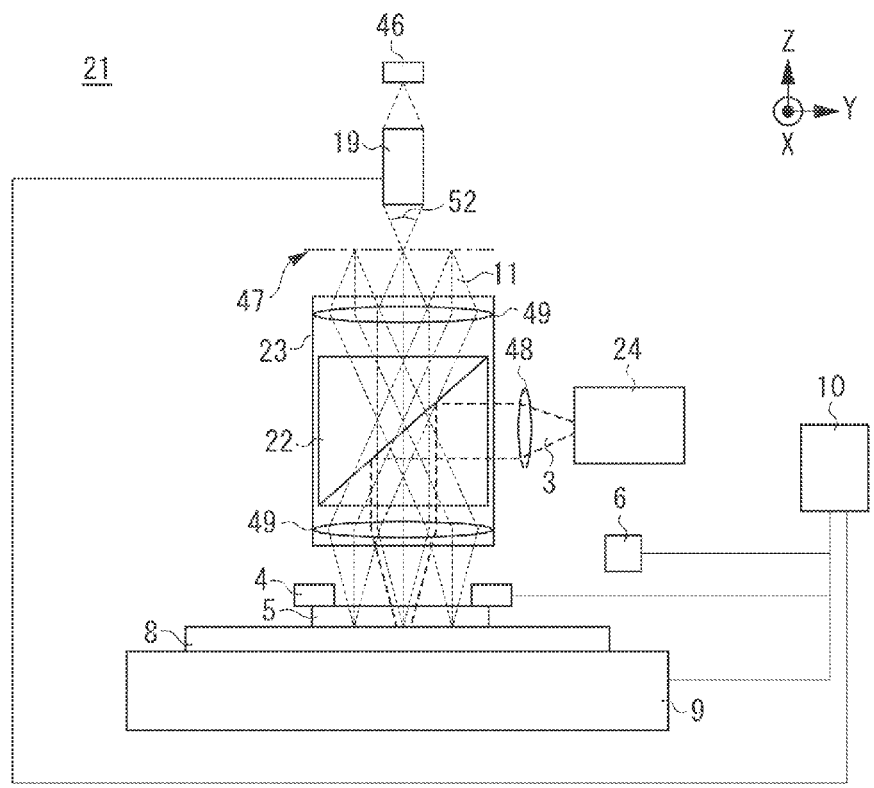
FIG. 1 schematically illustrates an imprint apparatus according to a second exemplary embodiment.

Various exemplary embodiments, features, and aspects of the embodiments will be described in detail below with reference to the drawings.

Hereinafter, exemplary embodiments of the present embodiments will be described with reference to the accompanying drawings. Like members are identified by like reference numerals throughout the drawings, and redundant descriptions will be omitted.

Figure 9:
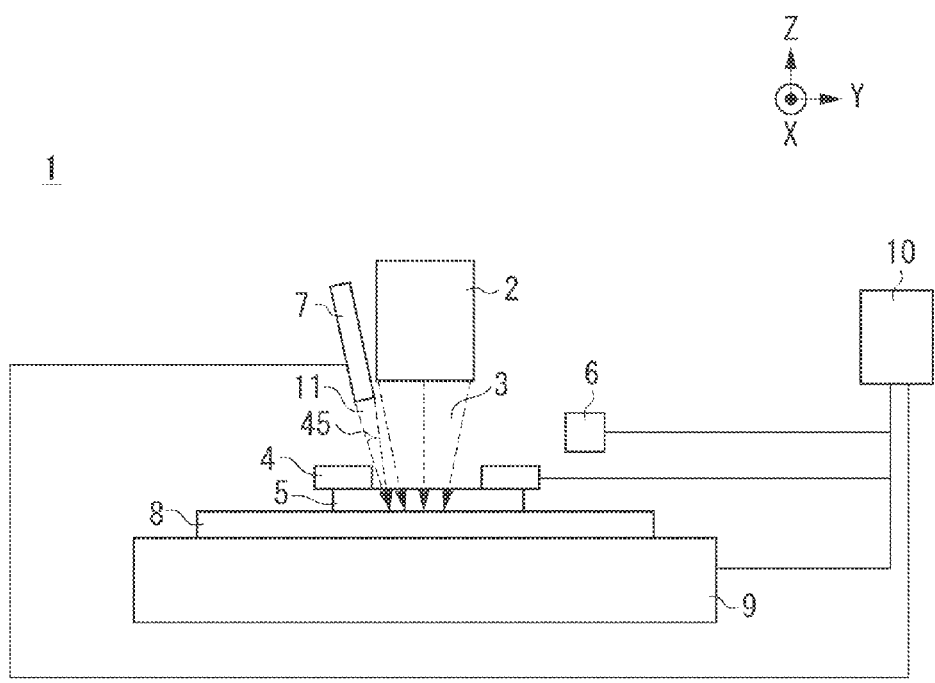
FIG. 9 schematically illustrates a conventional imprint apparatus.

A first exemplary embodiment will be described. FIG. 9 schematically illustrates the configuration of a conventional imprint apparatus 1. As illustrated in FIG. 9, the imprint apparatus 1 includes an illumination system 2 configured to emit illumination light 3 (mainly, ultraviolet light) for curing imprint resin, an imprint head 4 configured to hold a mold 5, and a wafer stage 9 configured to hold a wafer 8 as a substrate.

Further, the imprint apparatus 1 includes a TTM detection system 7, a resin coating mechanism 6, and a control unit 10. The X, Y, and Z axes of the imprint apparatus 1 are set as illustrated in FIG. 9.

The TTM detection system 7 may detect a mold alignment mark (not illustrated) formed on the mold 5 and a wafer alignment mark (not illustrated) formed on the wafer 8. The mold 5 and the wafer 8 may be aligned with each other based on the detection result of the alignment marks. The TTM detection system 7 emits measurement light 11 (mainly, visible light or infrared light) to the mold alignment mark and the wafer alignment mark with use of a light source provided in the TTM detection system 7, and then detects the reflected light therefrom. The TTM detection system 7 is provided with, for example, a photoelectric conversion element (for example, a charge coupled device (CCD)) as a light-receiving element for detecting the reflected light.

At this time, the mold 5 and the wafer 8 may be set in an aligned relative positional (X, Y, and Z) with each other by aligning the positions and focuses of the mold alignment mark and the wafer alignment mark with each other. The detection result of the TTM detection system 7 is output to the control unit 10, and the control unit 10 may adjust the position of the mold 5 or the wafer 8 in the X and Y directions by controlling the wafer stage 9 or the imprint head 4 in the X and Y directions based on the detection result of the TTM detection system 7.

During the detection of the alignment marks of the mold 5 and the wafer 8 by the TTM detection system 7, an interference fringe occurs with monochromatic light since the imprint resin is supplied on the wafer alignment mark. Therefore, in this case, the TTM detection system 7 detects the alignment signal with the signal of the interference fringe added thereto, making accurate detection impossible. Further, use of light in the ultraviolet range as the measurement light 11 results in an exposure of the imprint resin supplied on the wafer alignment mark to light. Therefore, generally, it is desirable to use wideband light having a wavelength of non-exposure light as the illumination light source of the TTM detection system 7 to detect a signal less contaminated by an interference fringe. The term "non-exposure light" is used to refer to light having a wavelength different from light emitted to cure imprint resin.

After alignment between the mold 5 and the wafer 8 ends, the pattern formed on the mold 5 is transferred. Imprint resin is supplied to the wafer 8 with use of the resin coating mechanism 6. The imprint head 4 moves while holding the mold 5, and brings the imprint resin supplied on the wafer 8 and the pattern formed on the mold 5 into contact with each other (imprint). While the mold 5 and the wafer 8 are kept in this state, illumination light 3 (ultraviolet light) is emitted from the illumination system 2 to cure the imprint resin. After the imprint resin is cured, the mold 5 and the cured imprint resin are separated from each other (mold release).

How to transfer a pattern by the imprint technique with use of the imprint apparatus 1 will be described with reference to FIGS. 8A to 8D. A pattern 13 to be transferred onto the imprint resin on the substrate is formed on the mold 5.

Figure 8A:
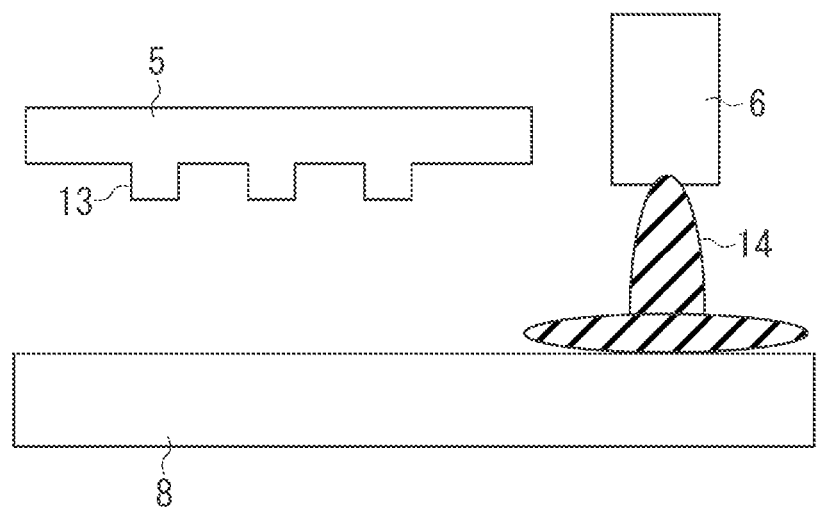
FIG. 8A schematically illustrates an imprint technique.
Figure 8B:
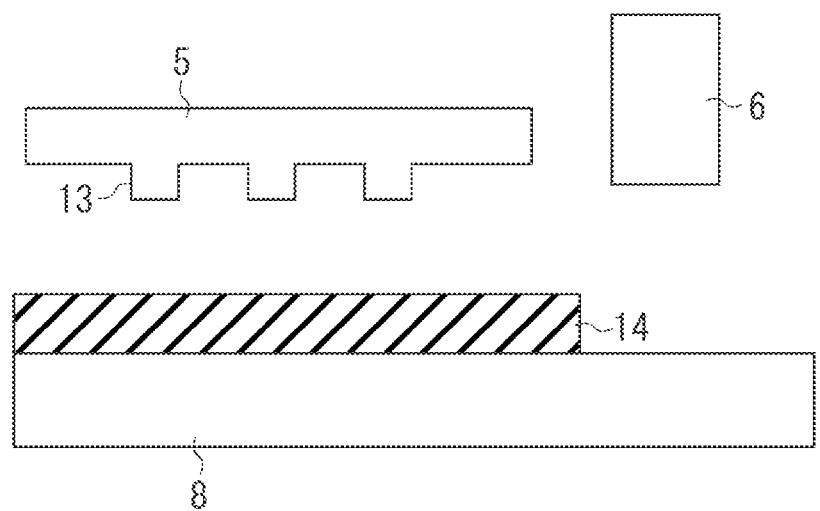
FIG. 8B schematically illustrates the imprint technique.
Figure 8C:
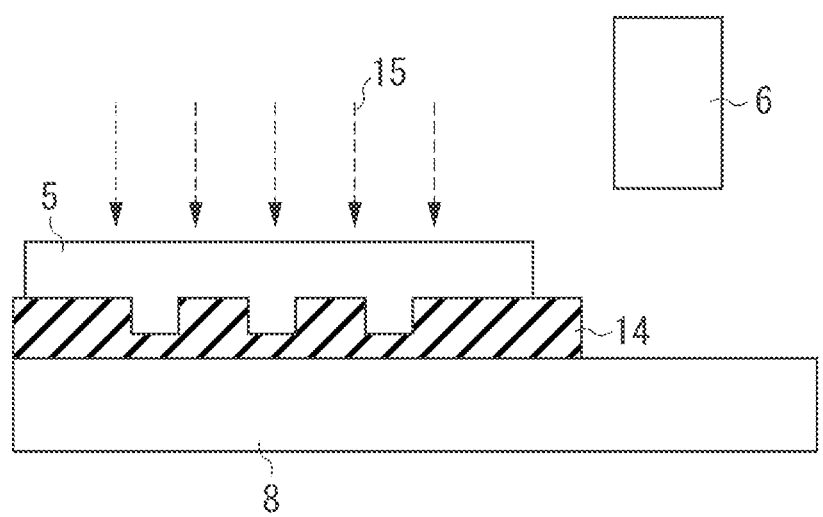
FIG. 8C schematically illustrates the imprint technique.

First, as illustrated in FIG. 8A, the resin coating mechanism 6 supplies imprint resin 14 as an imprint material onto the wafer 8. This example will be described assuming that the imprint resin 14 is photo curable resin, which is cured by being irradiated with light. The wafer stage 9 moves so that the wafer 8 with the imprint resin 14 supplied thereto is located right below the mold 5, as illustrated in FIG. 8B. After the wafer 8 with the imprint resin 14 supplied thereto is located right below the mold 5, the mold 5 is pressed against the imprint resin 14 on the wafer 8, as illustrated in FIG. 8C. In this example, the mold 5 is pressed against the imprint resin 14. However, instead, a wafer chuck may move to press the imprint resin 14 supplied to the wafer 8 against the mold 5. Alternatively, the mold 5 and the wafer 8 may be pressed against each other.

Figure 8D:
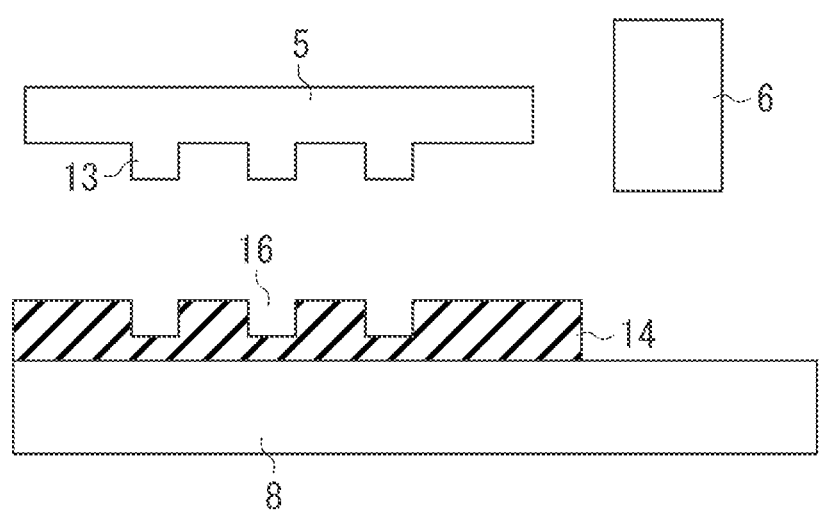
FIG. 8D schematically illustrates the imprint technique.

While the mold 5 is kept pressed against the imprint resin 14, ultraviolet light 15 is emitted from the illumination system 2 to cure the imprint resin 14. After the imprint resin 14 is cured, the mold 5 is separated from the imprint resin 14, as illustrated in FIG. 8D. As a result, the pattern 13 formed on the mold 5 is transferred onto the imprint resin 14, and thereby a pattern 16, which is a reversal pattern of the pattern 13, may be formed.

Then, the wafer stage 9 is moved, and the imprint resin 14 is supplied to the next shot to transfer the pattern thereto. Repeatedly applying the mold imprint and mold release to the shots on the wafer 8 in this way may result in formation of the pattern 16 on all of the shots on the wafer 8.

Figure 7A:
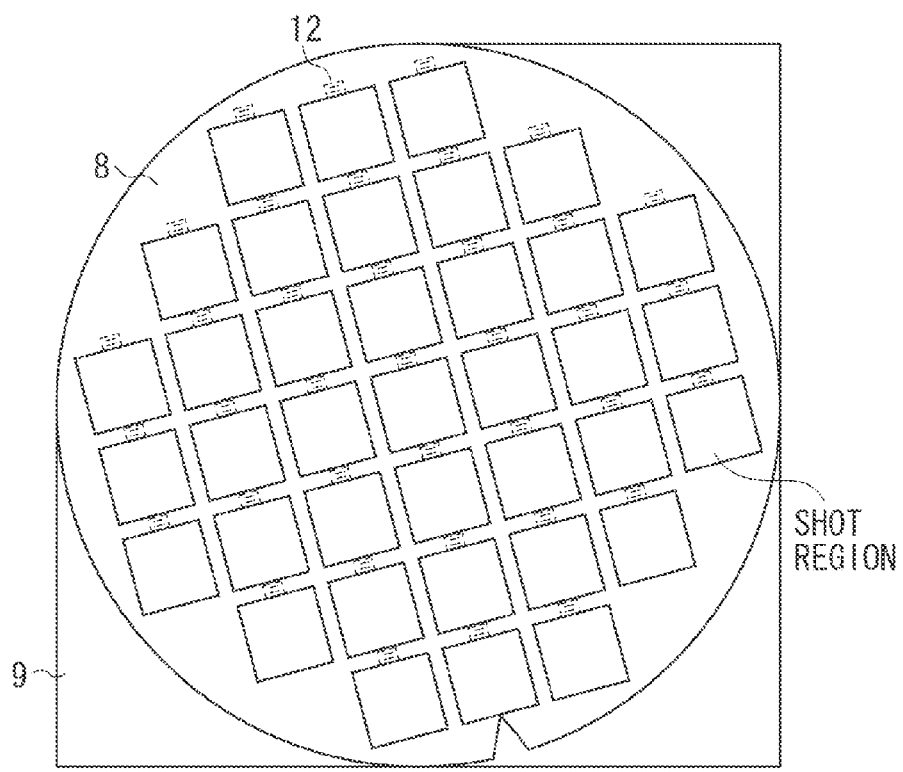
FIG. 7A illustrates a substrate and an alignment mark.
Figure 7B:
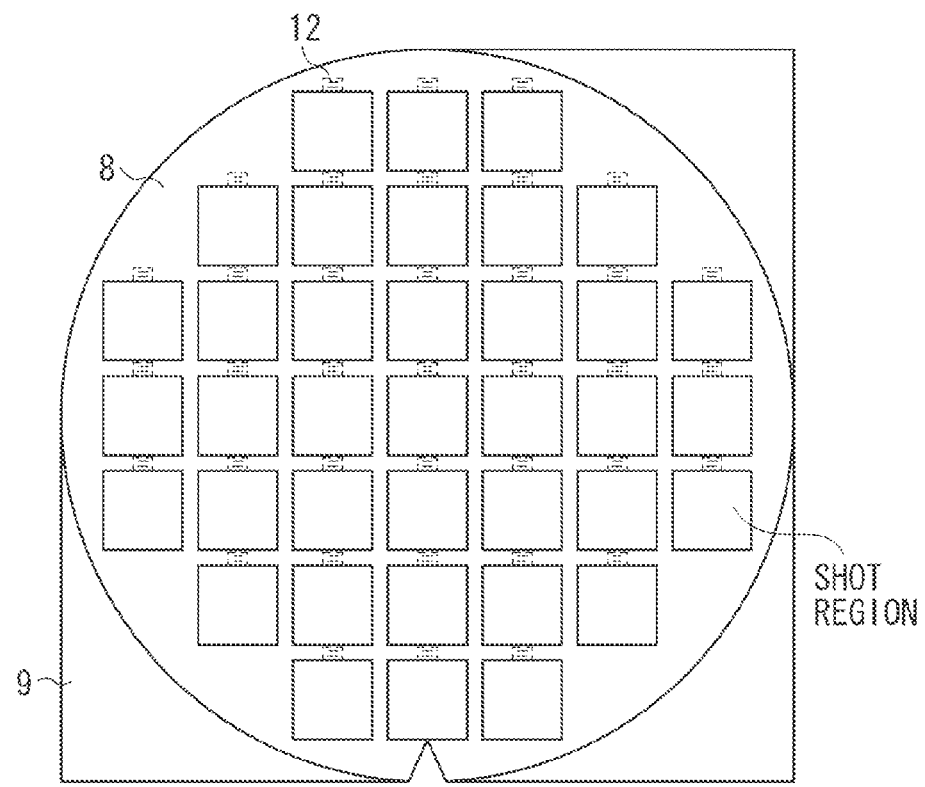
FIG. 7B illustrates the substrate and the alignment mark.

However, a force is applied to the wafer 8 due to the imprint and release of the mold 5. An application of the force may cause the position of the wafer 8 to be displaced relative to the wafer stage 9, as illustrated in FIG. 7A. This is because the mold 5 contacts the imprint resin 14 supplied on the substrate (wafer) 8, unlike conventional optical exposure apparatus. If the mold 5 is imprinted on the next shot in such a state that the wafer 8 is displaced relative to the wafer stage 9 as illustrated in FIG. 7A, the pattern is misaligned with a pattern on a foundation, thereby causing a reduction in the yield rate of devices. This leads to the necessity of an alignment method (die-by-die alignment) in which the mold imprint and the mold release is applied to a shot, and an alignment mark 12 of the next shot is measured before the mold is imprinted on the next shot, thereby correcting the misalignment of the wafer 8. According to the die-by-die alignment method, the alignment mark 12 of a shot is measured for each shot, and misalignment of the wafer 8 is corrected, whereby it is possible to reduce the influence of misalignment of the wafer 8 that may occur due to the mold imprint and the mold release, and thereby possible to align the mold 5 with the pattern on the foundation with high accuracy.

However, in the conventional imprint apparatus 1 illustrated in FIG. 9, the TTM detection system 7 is arranged to get out of the way of the illumination system 2 and the illumination light flux of the illumination light 3. Therefore, there is such a problem that an NA of the TTM detection system 7 may not be sufficiently increased. An NA 45 of the TTM detection system 7 depends on the size of the TTM detection system 7 in itself, and the TTM detection system 7, which is arranged to get out of the way of the illumination system 2 and the illumination light flux of the illumination light 3, may not be increased in its size, which inevitably makes an increase of the NA 45 impossible.

The inability to increase the NA 45 of the TTM detection system 7 sufficiently leads to a reduction in the light amount during an alignment operation, thereby reducing the alignment accuracy. Since the TTM detection system 7 establishes the alignment by simultaneously detecting the alignment mark formed on the mold 5 and the alignment mark formed on the wafer 8, the TTM detection system 7 is required to be arranged above the mold 5. However, upper part of the mold 5 is configurationally congested, and therefore the conventional imprint apparatus 1 may not increase the NA 45 of the TTM detection system 7, so that the alignment accuracy is degraded. If the alignment accuracy of the TTM detection system 7 is degraded, misalignment of the wafer 8 may not be accurately corrected during the die-by-die alignment, thereby causing a failure in overlaying the mold 5 with the pattern on the foundation during imprinting by the mold 5, and causing a reduction in the yield rate of devices.

Therefore, exemplary embodiments are characterized in that they allow an increase in the NA 45 of the TTM detection system 7, which directly aligns the mold 5 and the wafer 8 with each other, to provide an imprint apparatus capable of improving the alignment accuracy. As a result, the exemplary embodiments may overlay the pattern formed on the mold 5 and a shot region of the wafer 8 with each other highly accurately, thereby contributing to an increase in the yield rate.

Figure 3:
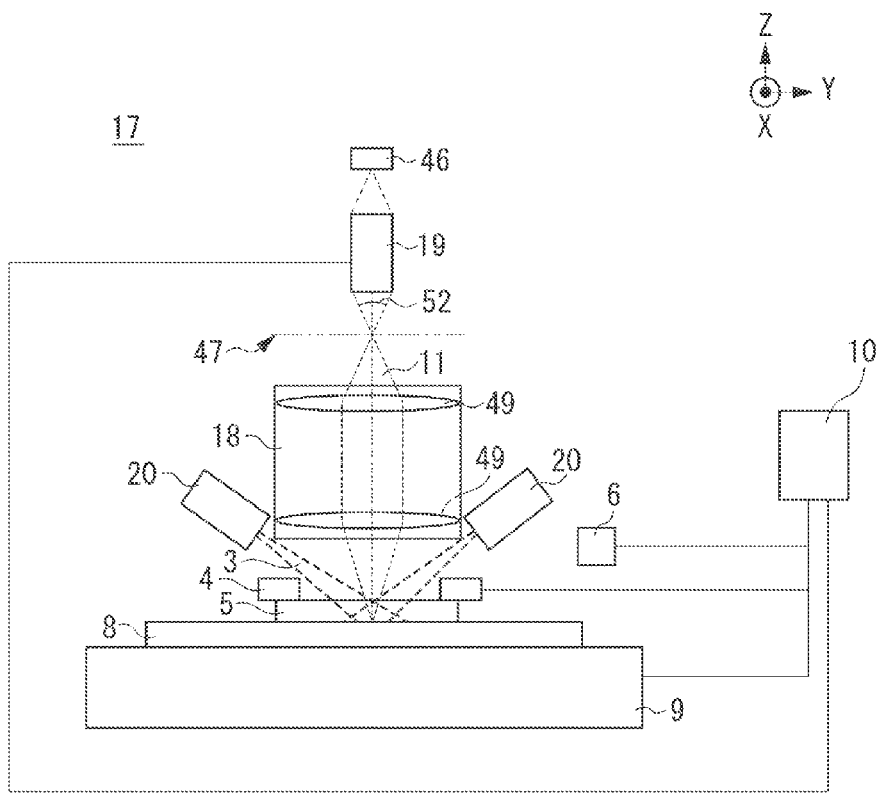
FIG. 3 schematically illustrates an imprint apparatus according to a first exemplary embodiment.

FIG. 3 schematically illustrates the configuration of an imprint apparatus 17 according to a first exemplary embodiment. FIG. 3 illustrates the imprint apparatus 17 characterized in that a relay optical system 18 is provided above the mold 5 (above in the Z axis direction). As illustrated in FIG. 3, the imprint apparatus 17 according to the first exemplary embodiment includes the wafer stage 9 configured to hold the wafer 8, the imprint head 4 configured to hold the mold 5, the resin coating mechanism 6, and the control unit 10.

The relay optical system 18 includes a relay optical system internal lens 49, and thereby may create an imaging plane 47 (conjugate plane) of the wafer surface, where an image of the wafer surface is formed, above the mold 5. The relay optical system 18 functions to form an image on the wafer surface via the mold 5, and the magnification of the relay optical system 18 may be the same magnification or an enlargement magnification, as long as the relay optical system 18 may form an image of the wafer surface. It is desirable that the size of the screen of the relay optical system 18 (the area of the wafer surface to be image-formed) corresponds to a whole one shot region. Forming an image of a whole shot region enables to detect a plurality of marks corresponding to the shot. Further, the size of the screen of the relay optical system 18 may be larger than the area of the illumination light of an illumination system with which the imprint material on the substrate is irradiated. In this way, it is possible to form an image of a mark formed outside the area to which the pattern formed on the mold 5 is transferred, by the relay optical system 18. The formed image of the mark is guided to a light-receiving element by a detection system, thereby executing mark detection.

A TTM detection system 19 (detection optical system) uses a light source mounted therein to emit measurement light 11 (mainly, visible light or infrared light) to an alignment mark formed on the mold 5 and an alignment mark formed on the wafer 8, and detects the reflected light therefrom. The above-described TTM detection system 7 includes the light-receiving element therein, but a description will be provided, assuming that a light-receiving element 46 is provided separately from the TTM detection system 19.

The TTM detection system 19 is arranged above the relay optical system 18. The measurement light 11 emitted from the TTM detection system 19 is transmitted through the relay optical system internal lens 49 in the relay optical system 18, and illuminates the mold 5 and the wafer 8. The reflected light from the alignment mark formed on the mold 5 and the alignment mark formed on the wafer 8 is transmitted through the relay optical system 18 and the TTM detection system 19, and is detected by the light-receiving element 46 for the TTM detection system 19. The mold 5 and the wafer 8 may be aligned with each other based on the detection signal. The light-receiving element 46 may be embodied by, for example, a photoelectric conversion element (for example, a CCD camera). The imprint apparatus 17 is configured in such a manner that, especially when the mold 5 and the wafer 8 are located near each other or are in close contact with each other, the light reflected from the alignment mark formed on the mold 5 and the alignment mark formed on the wafer 8 is guided to the light-receiving element 46. In this way, the mold 5 and the wafer 8 may be aligned with each other before the imprint material is cured.

As illustrated in FIG. 3, the relay optical system 18 is arranged above the mold 5, which allows the position of the TTM detection system 19 to be shifted to a space having room configurationally while avoiding the configurational congestion above the mold 5. As illustrated in FIG. 3, arranging the TTM detection system 19 in a space having room configurationally enables to arrange the TTM detection system 19 even if it is increased in size, thereby enable to increase the NA of the TTM detection system 19. The NA 52 of the TTM detection system 19 illustrated in FIG. 3 may be increased to be sufficiently larger than the NA 45 of the TTM detection system 7 illustrated in FIG. 9. Since the NA 52 of the TTM detection system 19 may be increased, a sufficient light amount may be secured during an alignment operation. Therefore, the imprint apparatus 17 according to the present exemplary embodiment may improve the accuracy of die-by-die alignment compared to the conventional art. Accordingly, the imprint apparatus 17 according to the present exemplary embodiment may highly accurately correct misalignment of the wafer 5 which may occur at the time of the imprint of the mold 5 on the wafer 8 and the release of the mold 5 from the wafer 8, and may highly accurately align the pattern of the mold 5 with the pattern on the foundation at the time of the mold imprint. Thus, the imprint apparatus 17 according to the present exemplary embodiment may contribute to improvement of the yield rate of devices.

As illustrated in FIG. 3, the illumination system 20 of the imprint apparatus 17 according to the present exemplary embodiment may be arranged to be inclined relative to the optical axis of the measurement light 11 emitted from the TTM detection system 19, instead of being arranged right above the mold 5. According to this configuration, the illumination light 3 from the illumination system 20 emits light to cure the imprint resin after the mold 5 is imprinted on the wafer 8. The illumination light 3 may be transmitted through the mold 5 to allow the imprint resin to be irradiated with the illumination light 3. Therefore, the illumination light 3 (ultraviolet light) from the illumination system 20 does not pass through the relay optical system 18 illustrated in FIG. 3. Consequently, the present exemplary embodiment is also characterized by the relay optical system 18 having a relay lens configured to form an image of light (non-exposure light) different from the illumination light 3.

A second exemplary embodiment will be described with reference to FIG. 1.

In the imprint apparatus 17 illustrated in FIG. 3, the illumination system 20 is arranged to be inclined relative to the optical axis of the measurement light 11 from the TTM detection system 19. However, if possible, it is desirable to arrange the illumination system without tilting it so that the illumination light is incident perpendicularly on the wafer 8. Therefore, the second exemplary embodiment will be described as an imprint apparatus characterized by its configuration of arranging both a TTM detection system, which has a large NA value to realize high alignment accuracy, and an illumination system above the mold 5 so that both measurement light and illumination light may be incident perpendicularly on the wafer surface.

FIG. 1 is a block diagram schematically illustrating an imprint apparatus 21 including a relay optical system 23 equipped with a beam splitter 22 arranged above the mold 5.

As illustrated in FIG. 1, the imprint apparatus 21 includes the wafer stage 9 configured to hold the wafer 8, the imprint head 4 configured to hold the mold 5, the resin coating mechanism 6, and the control unit 10.

The TTM detection system 19 is arranged via the relay optical system 23. The measurement light 11 emitted from the TTM detection system 19 is transmitted through the relay optical system internal lens 49, the beam splitter 22 provided in the relay optical system 23, and the relay optical system internal lens 49, and illuminates the mold 5 and the wafer 8. The reflected light from the alignment mark formed on the mold 5 and the alignment mark formed on the wafer 8 is transmitted through the relay optical system 23 and the TTM detection system 19, and is detected by the light-receiving element 46 for the TTM detection system 19. The mold 5 and the wafer 8 may be aligned with each other based on the detection signal. The imaging plane 47 of the wafer surface, where an image of the wafer surface is formed, is created above the mold 5 by the relay optical system internal lens 49 provided in the relay optical system 23. The TTM detection system 19 may be configured similar to the TTM detection system 19 illustrated in FIG. 3.

The relay optical system 23 may create the imaging plane 47 of the substrate surface via the mold 5. The size of the screen of the relay optical system 18 (the area of the wafer surface to be image-formed) may be set to a whole shot region, as is the case with the relay optical system 18 according to the first exemplary embodiment. Further, the size of the screen of the relay optical system 18 may be set to be larger than the area of the illumination light of the illumination system which illuminates the imprint material. The size of the screen of the relay optical system 18 may be determined to be any size as long as at least it enables images of the alignment marks formed on the substrate corresponding to a shot to be formed simultaneously.

The TTM detection system 19 of the imprint apparatus 21 illustrated in FIG. 1 is arranged in a space having room configured to avoid the configurational congestion above the mold 5, as is the case with the imprint apparatus 17 illustrated in FIG. 3. This enables to arrange the TTM detection system 19 even if it is increased in size, thereby enabling to increase the NA of the TTM detection system 19. The NA 52 of the TTM detection system 19 illustrated in FIG. 1 may be increased to be sufficiently larger than the NA 45 of the TTM detection system 7 of the conventional imprint apparatus 1 illustrated in FIG. 9. Since the NA 52 of the TTM detection system 19 may be increased, a sufficient light amount may be acquired during an alignment operation. Therefore, the imprint apparatus 21 according to the second exemplary embodiment may improve the accuracy of die-by-die alignment compared to the conventional art. Accordingly, the imprint apparatus 21 according to the second exemplary embodiment may accurately correct misalignment of the wafer 5 which may occur at the time of the imprint of the mold 5 on the wafer 8 and the release of the mold 5 from the wafer 8, and may accurately align the pattern of the mold 5 with the pattern on the foundation at the time of the mold imprint. Consequently, the imprint apparatus 21 according to the second exemplary embodiment may contribute to improvement of the yield rate of devices.

An illumination system 24 in the imprint apparatus 21 according to the second exemplary embodiment is arranged in a space having room configured to avoid the configurational congestion above the mold 5, as is the case with the TTM detection system 19. The illumination light 3 emitted from the illumination system 24 is transmitted through an illumination system lens 48 to be guided to the beam splitter 22, and then is reflected by the beam splitter 22. The reflected illumination light 3 is transmitted through the relay optical system internal lens 49 and the mold 5, and the imprint resin supplied on the wafer 8 is irradiated with illumination light 3. The imprint resin is cured by being irradiated with the application of the illumination light 3. The beam splitter 22 is configured partially in common with the illumination system 24.

In this way, in the imprint apparatus 21 according to the second exemplary embodiment, the relay optical system 23 equipped with the beam splitter 22 is arranged above the mold 5, thereby allowing both the TTM detection system 19 and the illumination system 24 to be arranged in a space having room configurationally.

Further, the relay optical system 23 is a telecentric optical system (the off-axis principal ray is in parallel with the optical axis) which forms an image of a whole shot by light (non-exposure light) different from the illumination light 3. As described above, the relay optical system 23 may simultaneously form images of a plurality of alignment marks. Therefore, the respective points of the plurality of alignment marks may be measured by configuring the TTM detection system 19 to be movable and changing the position of the TTM detection system 19. Since the relay optical system 23 is a telecentric optical system, the off-axis principal ray is in parallel with the optical axis, so that the present exemplary embodiment may offer a merit of facilitating construction of a means of changing the image height of the TTM detection system 19. FIG. 1 illustrates an example in which images of three points on the wafer 8 are formed on the imaging plane 47 of the wafer surface, and reveals that different points of a wafer shot may be measured by changing the position of the TTM detection system 19. For simplification of illustration, FIG. 1 does not illustrate refraction of light within the beam splitter 22, but practically, light other than an axial ray of the relay optical system 23 incidents perpendicularly on the beam splitter 22 is slightly shifted when being transmitted through the beam splitter 22.

A third exemplary embodiment will be described with reference to FIG. 2.

As is the case with the above-described exemplary embodiments, the third exemplary embodiment is characterized in that a relay optical system is positioned between the detection system and the mold 5. Further, the detection system emits the illumination light to the mold 5 and the wafer 8 in this order via the relay optical system, and detects the reflected light from the alignment mark formed on the mold 5 and the alignment mark formed on the wafer 8. The third exemplary embodiment is configured to detect misalignment between the mold 5 and the wafer 8 based on the detection result, and align the mold 5 and the wafer 8 with each other.

The beam splitter 22 described in the description of the second exemplary embodiment is characterized in that it allows transmission of the measurement light 11 of the TTM detection system 19 and reflects the illumination light 3 emitted from the illumination system 24. However, the characteristic of the beam splitter 22 may be the other way around.

An imprint apparatus according to the third exemplary embodiment employs a beam splitter 26 characterized in that it reflects the measurement light 11 of the TTM detection system 19 and allows transmission of the illumination light 3 emitted from the illumination system 24. FIG. 2 is a block diagram schematically illustrating the imprint apparatus 25 equipped with the beam splitter 26.

The measurement light 11 emitted from the TTM detection system 19 is transmitted through a TTM detection system lens 50 to be guided to the beam splitter 26, and then is reflected by the beam splitter 26. The reflected measurement light 11 is transmitted through the relay optical system internal lens 49, and illuminates the mold 5 and the wafer 8. The reflected light from the alignment mark formed on the mold 5 and the alignment mark formed on the wafer 8 is transmitted through the TTM detection system 19, and is then detected by the light-receiving element 46 for the TTM detection system 19. The mold 5 and the wafer 8 may be aligned with each other based on the detection signal.

The relay optical system 23 may be configured similar to the relay optical system 23 described in the description of the second exemplary embodiment. However, the measurement light 11 is reflected by the beam splitter 26, and therefore the imaging plane 47 of the surface of the wafer (wafer surface) is formed by the relay optical system internal lens 49 provided in the relay optical system 23 and the TTM detection system lens 50. In this way, the imaging plane 47 of the wafer surface is formed above the mold 5. The TTM detection system 19 may be configured similar to the TTM detection system 19 illustrated in FIG. 3.

The size of the screen of the relay optical system 23 (the area of the wafer surface to be image-formed) may be set to a whole shot region, as is the case with the relay optical system 18 in the first exemplary embodiment. Further, the size of the screen of the relay optical system 23 may be set to be larger than the area of the illumination light of the illumination system 24 with which the imprint material is irradiated. The size of the screen of the relay optical system 23 may be determined to be any size as long as at least it enables images of the alignment marks formed on the substrate corresponding to a shot to be formed simultaneously.

The illumination light 3 emitted from the illumination system 24 is transmitted through the relay optical system internal lens 49, the beam splitter 26, and the relay optical system internal lens 49 provided in the relay optical system 23, and is further transmitted through the mold 5 to allow the imprint resin supplied on the wafer 8 to be irradiated with the illumination light 3. The imprint resin is cured by being irradiated with the illumination light 3.

In this way, the imprint apparatus 25 according to the third exemplary embodiment includes the beam splitter 26 characterized in that it reflects the measurement light 11 and allows transmission of the illumination light 3. Thus, it becomes possible to arrange the TTM detection system 19, which has an NA large enough to realize high alignment accuracy, and the illumination system 24 above the mold 5, as is the case with the second exemplary embodiment.

Figure 2:
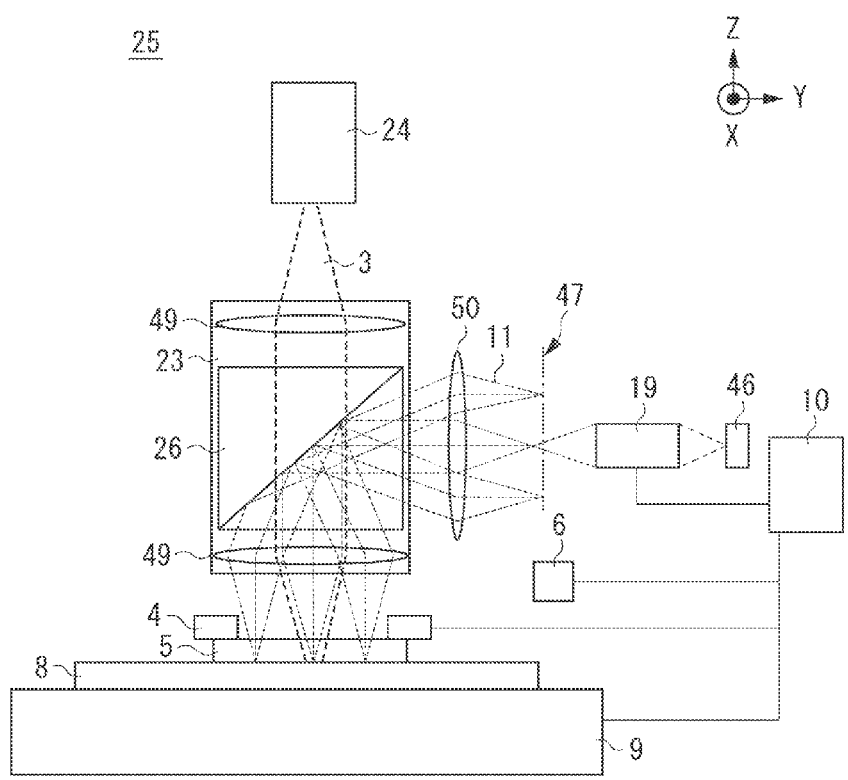
FIG. 2 schematically illustrates an imprint apparatus according to a third exemplary embodiment.

The imprint apparatus 25 illustrated in FIG. 2 is characterized in that the relay optical system 23 includes the beam splitter 26 characteristically configured to reflect the measurement light 11 emitted from the TTM detection system 19 and allow transmission of the illumination light 3 emitted from the illumination system 24. The beam splitter 26 does not necessarily have to be characteristically configured to completely reflect the light or completely allow transmission of the light. For example, the beam splitter 26 may be characteristically configured to reflect 90% of the measurement light 11 emitted from the TTM detection system 19 and allow transmission of remaining 10% of the measurement light 11. Further, the beam splitter 26 may be characteristically configured to allow transmission of 90% of the illumination light 3 emitted from the illumination system 24 and reflect remaining 10% of the illumination light 3. The ratio of reflection and transmission of the beam splitter 26 may be, for example, 8:2 or 7:3, instead of 9:1.

A fourth exemplary embodiment will be described with reference to FIG. 4.

An imprint apparatus including a relay optical system equipped with a beam splitter illustrated in FIGS. 1 and 2 may offer such merits that it allows both the TTM detection system and the illumination system to be arranged above the mold, and the NA of the TTM detection system to be increased sufficiently. However, it may be difficult to realize the characteristic feature of the beam splitter provided in the relay optical system. Even if it is possible to realize the characteristic feature of the beam splitter, the beam splitter may be expensive. On the other hand, in the relay optical system 18 without a beam splitter illustrated in FIG. 3, although the NA 52 of the TTM detection 19 system may be increased sufficiently and the TTM detection system 19 may be arranged above the mold 5, there is no choice but to arrange the illumination system 20 obliquely relative to the optical axis of the TTM detection system 18.

Therefore, the fourth exemplary embodiment will be described as an example of an imprint apparatus including a relay optical system without a beam splitter. The fourth exemplary embodiment is characterized in that both the TTM detection system having a sufficiently large NA and the illumination system are arranged above the mold 5, and their positions are switched around.

Figure 4A:
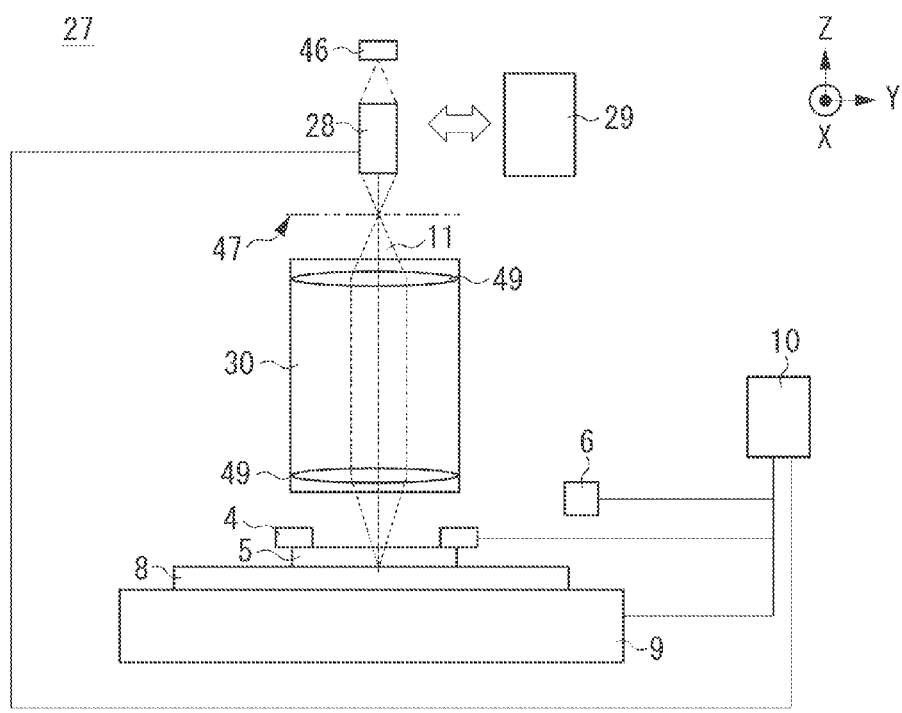
FIG. 4A schematically illustrates an imprint apparatus according to a fourth exemplary embodiment.
Figure 4B:
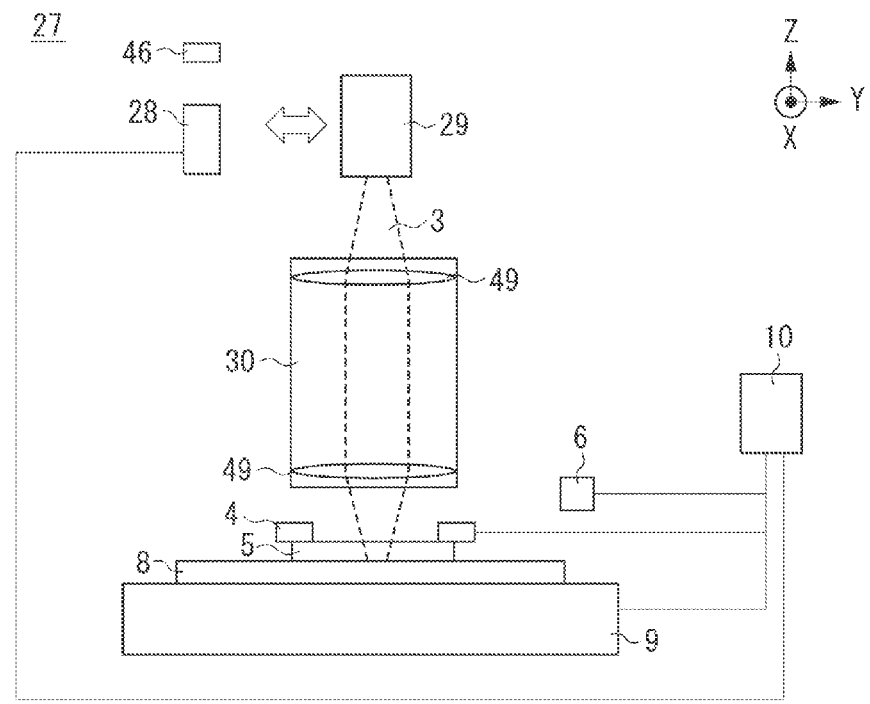
FIG. 4B schematically illustrates the imprint apparatus according to the fourth exemplary embodiment.

FIGS. 4A and 4B are block diagrams schematically illustrating an imprint apparatus 27 which switches the TTM detection system and the illumination system according to the fourth exemplary embodiment. As illustrated in FIGS. 4A and 4B, the imprint apparatus 27 according to the fourth exemplary embodiment includes the wafer stage 9 configured to hold the wafer 8, the imprint head 4 configured to hold the mold 5, the resin coating mechanism 6, and the control unit 10.

A TTM detection system 28 and an illumination system 29 are arranged with respect to the mold 5 and the wafer 8 via the relay optical system 30, and each include a drive mechanism (not illustrated). During an alignment operation, as illustrated in FIG. 4A, the measurement light 11 emitted from the TTM detection system 28 (the detection optical system) is transmitted through the relay optical system internal lens 49 provided in the relay optical system 30, and illuminates the mold 5 and the wafer 8. The reflected light from the alignment mark formed on the mold 5 and the alignment mark formed on the wafer 8 is transmitted through the relay optical system 30 and the TTM detection system 28, and is then detected by the light-receiving element 46 for the TTM detection system 28. The mold 5 and the wafer 8 may be aligned with each other based on the detection signal.

The relay optical system 30 may form the imaging plane 47 of the wafer surface via the mold 5. The size of the screen of the relay optical system 30 (the area of the wafer surface to be image-formed) may be set to a whole shot region, as is the case with the relay optical system 18 in the first exemplary embodiment. Further, the size of the screen of the relay optical system 30 may be set to be larger than the area of the illumination light of the illumination system 29 which illuminates the imprint material. The size of the screen of the relay optical system 23 may be determined to be any size as long as at least it enables images of the alignment marks formed on the substrate corresponding to a shot to be formed simultaneously. The imaging plane 47 of the surface of the wafer (wafer surface) is formed by the relay optical system internal lens 49 provided in the relay optical system 30. In this way, the imaging plane 47 of the wafer surface is formed above the mold 5. The TTM detection system 28 may be configured similar to the TTM detection system 19 illustrated in FIG. 3.

On the other hand, when the wafer 8 is irradiated with the illumination system 29, as illustrated in FIG. 4B, the TTM detection system 28 is replaced with the illumination system 29. The illumination light 3 emitted from the illumination system 29 is transmitted through the relay optical system internal lens 49 provided in the relay optical system 30 and the mold 5, and allows the imprint resin supplied on the wafer 8 to be irradiates with the illumination light 3. The imprint resin is cured by being irradiated with the illumination light 3.

In this way, according to the imprint apparatus 27 which switches the TTM detection system 28 and the illumination system 29, it is possible to arrange the TTM detection system 28 having a sufficiently increased NA and the illumination system 29 above the mode 5 without providing a beam splitter in the relay optical system 30.

A fifth exemplary embodiment will be described with reference to FIGS. 5A to 5C.

For simplification of description, the preceding exemplary embodiments have been described assuming that there is only one system provided as the TTM detection system. However, the TTM detection system may be configured with a plurality of systems. For example, when it is required to measure alignment marks formed at a plurality of positions of a shot simultaneously during execution of die-by-die alignment, it is desirable to provide a plurality of the TTM detection systems. Even if only one TTM detection system is provided, it is possible to measure alignment marks formed at a plurality of positions of a shot by moving the stage or moving the TTM detection system. However, a problem arises in this case; due to a movement of the stage or the detection system, the alignment accuracy is easily deteriorated, and the throughput is also reduced. Upper part of the mold 5 is configurationally congested, and conventionally it is difficult to arrange a plurality of TTM detection systems above the mold 5 due to the configuration.

Therefore, the fifth exemplary embodiment is characterized in that a plurality of TTM detection systems (detection optical systems) having a sufficiently increased NA is arranged above the mold 5 by providing a relay optical system above the mold 5.

Figure 5A:
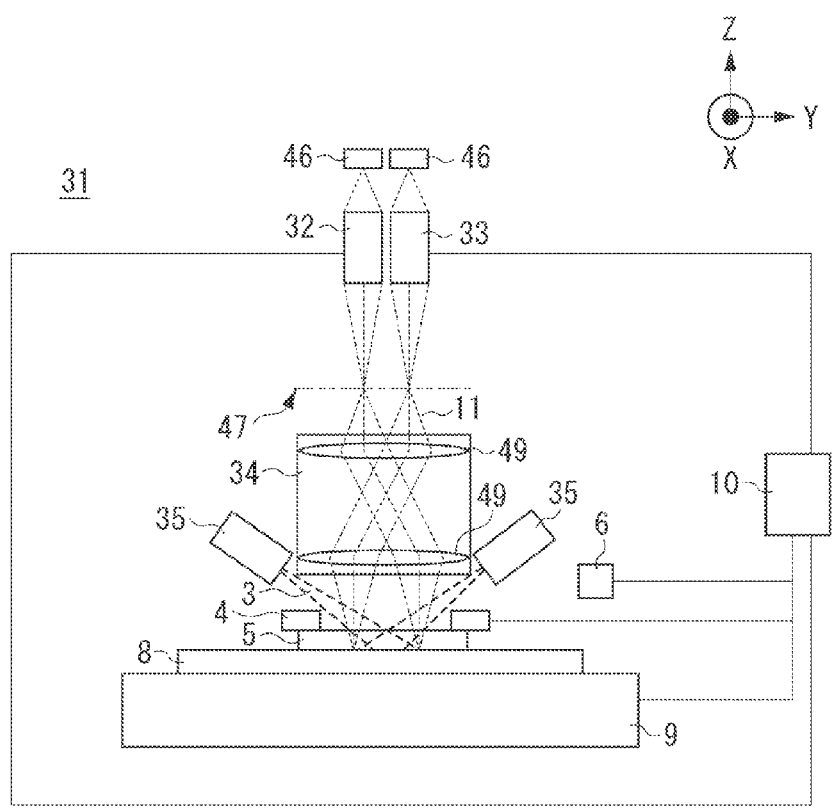
FIG. 5A schematically illustrates an imprint apparatus according to a fifth exemplary embodiment.
Figure 5B:
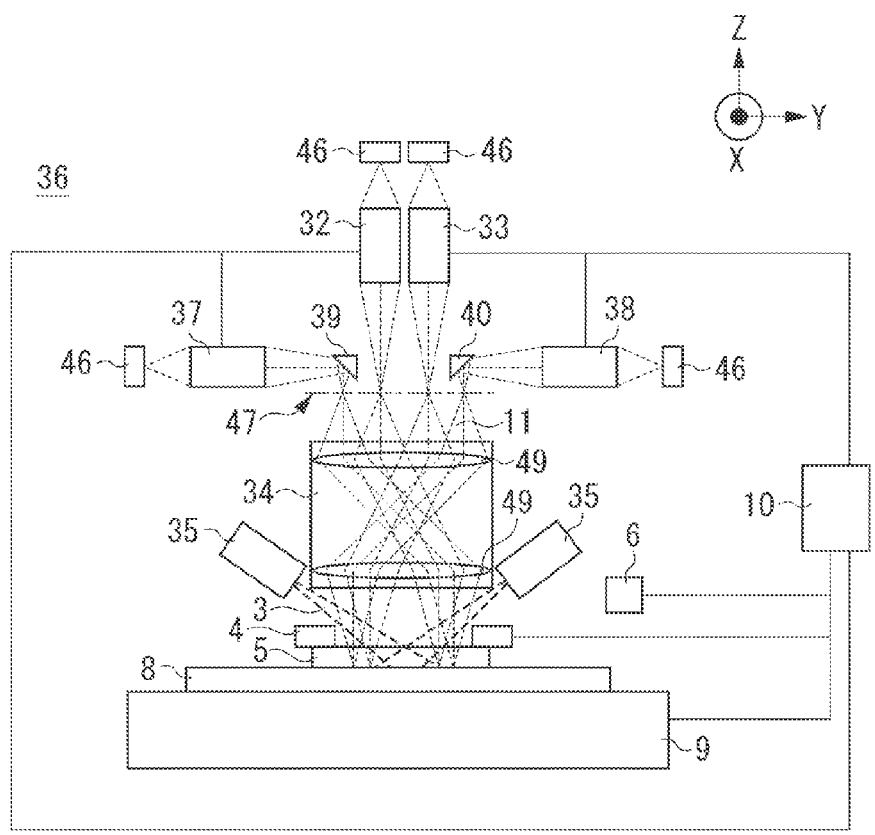
FIG. 5B schematically illustrates an imprint apparatus according to the fifth exemplary embodiment.
Figure 5C:
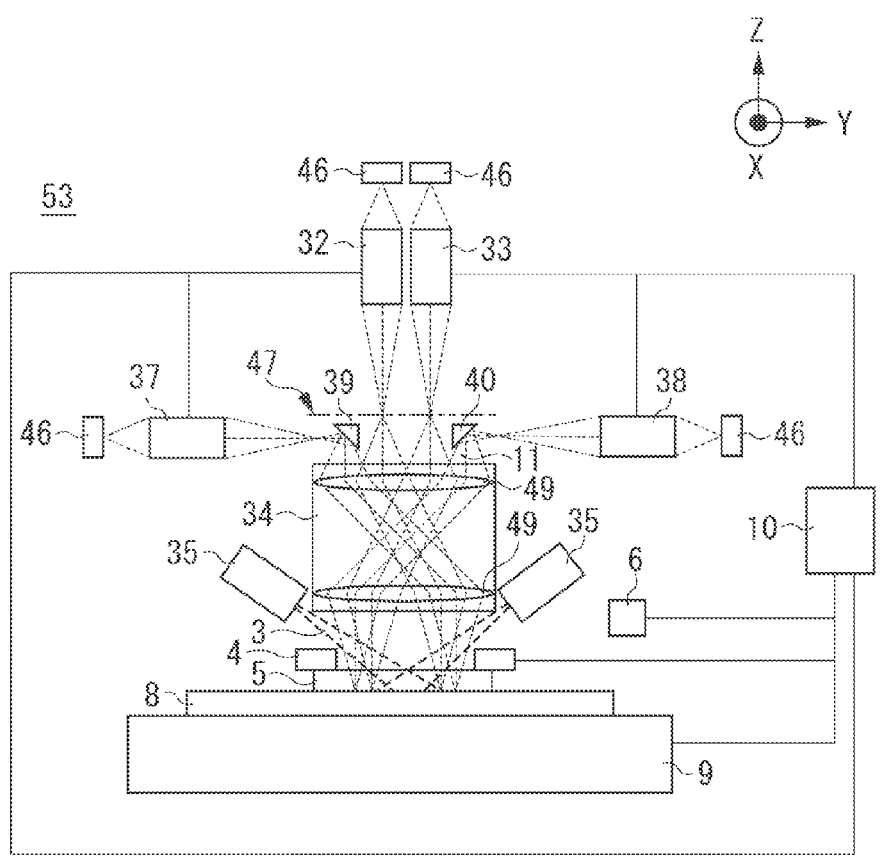
FIG. 5C schematically illustrates an imprint apparatus according to the fifth exemplary embodiment.

FIGS. 5A to 5C are block diagrams each schematically illustrating an imprint apparatus including a plurality of TTM detection systems according to the fifth exemplary embodiment. As illustrated in FIGS. 5A to 5C, the imprint apparatus according to the fifth exemplary embodiment includes the wafer stage 9 configured to hold the wafer 8, the imprint head 4 configured to hold the mold 5, the resin coating mechanism 6, and the control unit 10.

FIG. 5A is a block diagram schematically illustrating an imprint apparatus 31 including two TTM detection systems arranged above the mold 5. A relay optical system 34 is provided above the mold 5, and the TTM detection systems may be positioned in a space having room configured to avoid the configurationally congested space above the mold 5. In the example illustrated in FIG. 5A, a TTM detection system 32 and a TTM detection system 33 are positioned in a space having room configurationally, and therefore they may have sufficiently large NAs, respectively, thereby realizing high alignment accuracy.

Providing two TTM detection systems allows two different alignment marks of a single shot to be detected simultaneously, thereby realizing highly accurate alignment measurement. For example, detection of an alignment mark in the X direction and an alignment mark in the Y direction enables simultaneous execution of alignment measurement in the X direction and alignment measurement in the Y direction. Further, detection of two different alignment marks in a shot enables even a correction of the shot shape.

Further, the relay optical system 34 according to the fifth exemplary embodiment is a telecentric optical system which forms an image of a whole shot by light (non-exposure light) different from the illumination light 3, and allows a plurality of TTM detection systems to be arranged. The relay optical system 34 may form the imaging plane 47 of the wafer surface via the mold 5. The relay optical system 34 may be configured similar to the relay optical system 18 described in the description of the first exemplary embodiment. Alternatively, the relay optical system 34 may be configured similar to the relay optical system 23 described in the description of the second and third exemplary embodiments. Further, a beam splitter may be provided in the relay optical system 34, so that the optical path of the illumination light 3 emitted from the illumination system 24 and a part of the optical path of the measurement light 11 are configured in common.

Further, the relative positions of the TTM detection system 32 and the TTM detection system 33 illustrated in FIG. 5A may be changed. It is possible to measure each point of a wafer shot by changing the positions of the TTM detection system 32 and the TTM detection system 33. The size of the screen of the relay optical system 34 (the area of the wafer surface to be image-formed) may be determined to be any size as long as at least it enables images of a plurality of alignment marks formed on the substrate to be formed simultaneously.

The measurement light 11 emitted from the TTM detection system 32 and the TTM detection system 33 is transmitted through the relay optical system 34, and illuminates the mold 5 and the wafer 8. The reflected light from the alignment mark formed on the mold 5 and the alignment mark formed on the wafer 8 is transmitted through the relay optical system 34, the TTM detection system 32, and the TTM detection system 33, and is detected by each of the light-receiving elements 46 for the TTM detection systems 32 and 33. The mold 5 and the wafer 8 may be aligned with each other based on the detection signal. The imaging plane 47 of the wafer surface, where an image of the wafer surface is formed, is formed above the mold 5 by the relay optical system internal lens 49 provided in the relay optical system 34. The TTM detection systems 32 and 33 may be configured similar to the TTM detection system 19 illustrated in FIG. 3.

In the imprint apparatus 31 according to the present exemplary embodiment, it is only necessary for the illumination system 35 to illuminate the imprint resin supplied on the wafer 8 after the imprint of the mold 5 on the wafer 8 with the illumination light 3. Therefore, the illumination system 35 may be arranged to be inclined relative to the optical axis of the measurement light 11 emitted from the TTM detection system 32 and the TTM detection system 33, instead of being arranged above the mold 5. The above described arrangement allows the illumination light 3 emitted from the illumination system 35 to be transmitted through the mold 5 to allow the imprint resin supplied on the wafer 8 to be irradiated after the imprint of the mold 5 on the wafer 8. The imprint resin is cured by being irradiated with the application of the illumination light 3. In this way, the illumination light 3 (ultraviolet light) emitted from the illumination system 35 does not pass through the relay optical system 34 illustrated in FIG. 5A. Therefore, the relay optical system 34 according to the present exemplary embodiment is also characterized by the relay lens which forms an image of light (non-exposure light) different from the illumination light 3.

The imprint apparatus 31 described with reference to FIG. 5A is arranged with two systems as the plurality of TTM detection systems. However, the imprint apparatus may include any plural number of TTM detection systems such as three systems or four systems, instead of two systems.

FIG. 5B is a block diagram schematically illustrating an imprint apparatus 36 including four TTM detection systems arranged above the mold 5. In the fifth exemplary embodiment, the relay optical system 34 is provided above the mold 5, so that the TTM detection systems may be arranged in a space having room configurationally. Therefore, the TTM detection systems may be arranged not only in the vertical direction (the Z direction) but also in the horizontal direction (the X direction and the Y direction).

The imprint apparatus 36 includes a TTM detection system 37 and a TTM detection system 38 arranged in the Y direction, in addition to the TTM detection system 32 and the TTM detection system 33 arranged in the Z direction similar to the imprint apparatus 31 illustrated in FIG. 5A, so that the imprint apparatus 36 includes four TTM detection systems in total. In the present exemplary embodiment, the TTM detection system 32 and the TTM detection system 33 are the same as the TTM detection systems described with reference to FIG. 5A. The measurement light 11 emitted from the TTM detection system 37 and the measurement light 11 emitted from the TTM detection system 38 are reflected by a mirror 39 and a mirror 40, respectively, are transmitted through the relay optical system 34, and then transmitted to the mold 5 and the wafer 8. The reflected light from the alignment mark formed on the mold 5 and the alignment mark formed on the wafer 8 is transmitted through the relay optical system 34, the TTM detection system 37, and the TTM detection system 38, and is then detected by each of the light-receiving elements 46 for the TTM detection systems 37 and 38. The mold 5 and the wafer 8 may be aligned with each other based on the detection signal.

The mirror 39 and the mirror 40 are arranged near the imaging plane 47, and may bend the reflected light to allow the light-receiving elements 46 to detect it. It is possible to bend (reflect) the light before the light effective diameter is increased by arranging the mirror near the imaging plane 47, and thereby it is possible to easily arrange a plurality of TTM detection systems.

In the example illustrated in FIG. 5B, the mirror 39 and the mirror 40 are arranged behind the imaging plane 47. However, the mirror 39 and the mirror 40 may be disposed ahead of the imaging plane 47. It is possible to reduce the height of the whole imprint apparatus 36 and improve degree of freedom of design by disposing the mirrors 39 and 40 at or near the imaging place 47 formed by the relay optical system 34 in this way. Further, the present exemplary embodiment bends a part of light fluxes. However, when the height of the apparatus is desired to be further reduced, the detection systems may be arranged in the horizontal direction by bending all light fluxes.

FIG. 5C is a block diagram schematically illustrating an imprint apparatus 53 including the mirror 39 and the mirror 40 disposed ahead of the imaging plane 47. The TTM detection system 37 and the TTM detection system 38 illustrated in FIG. 5C are characterized in that the mirror 39 and the mirror 40 bend a part of light beams before the relay optical system 34 forms the imaging plane 47. As is the case with the example illustrated in FIG. 5B, it is possible to bend the light before the light effective diameter is increased, and thereby it is possible to easily arrange a plurality of TTM detection systems.

The relay optical system 34 may be configured similar to any of the relay optical systems 18, 23, and 30 described in the descriptions of the preceding exemplary embodiments. However, when a mirror is arranged to bend the reflected light before formation of the imaging plane 47 as illustrated in FIG. 5C, the imaging plane 47 is not necessarily formed. In this case, after the light is bent by the mirror 39 and the mirror 40, an image of the light reflected from the alignment mark is formed. For this reason, the mirror 39 and the mirror 40 may be regarded as a part of the relay optical system 34. As used herein, even such a case is also expressed by the phrase "the relay optical system forms the imaging plane 47 of the wafer surface".

In this way, use of the method of arranging the relay optical system above the mold 5 may ease a configurational congestion above the mold 5, and enables to arrange a plurality of TTM detection systems having sufficiently large NAs. Consequently, even when a plurality of alignment marks is simultaneously detected, the TTM detection systems may secure a sufficient light amount, thereby realizing highly accurate alignment.

A sixth exemplary embodiment will be described with reference to FIGS. 6A to 6C.

For simplification of illustration and description, in the examples illustrated in FIG. 5A to 5C, the illumination system 35 is arranged to be inclined relative to the optical axis of the TTM detection systems. However, even when a plurality of TTM detection systems is arranged above the mold 5, the imprint system may be configured in such a manner that the illumination light from the illumination system is incident perpendicularly on the wafer 8.

Figure 6A:
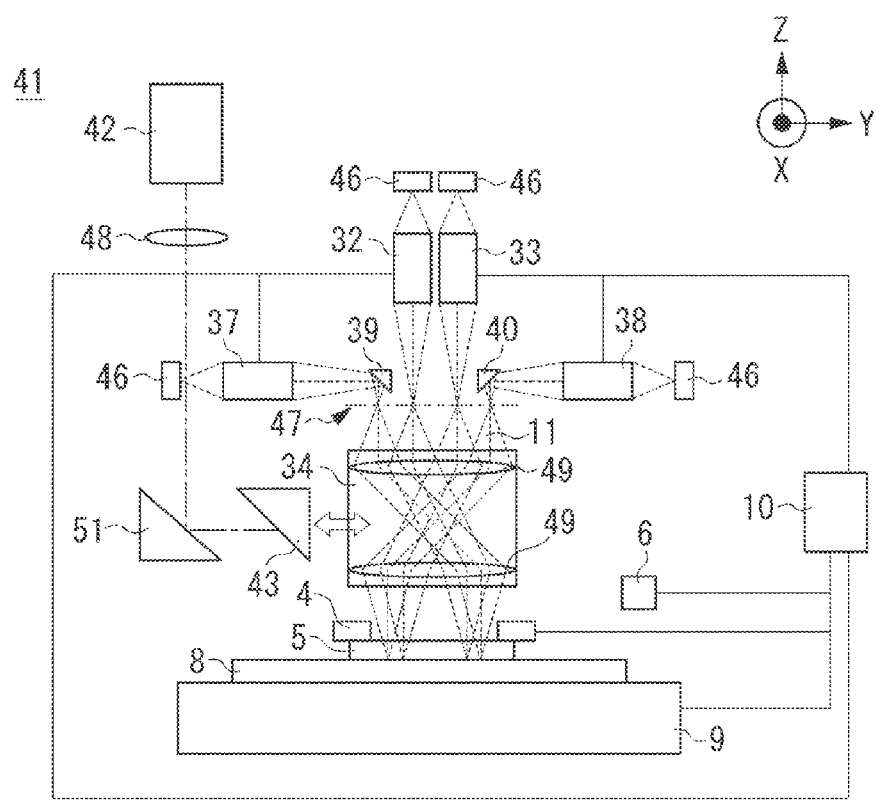
FIG. 6A schematically illustrates an imprint apparatus according to a sixth exemplary embodiment.
Figure 6B:
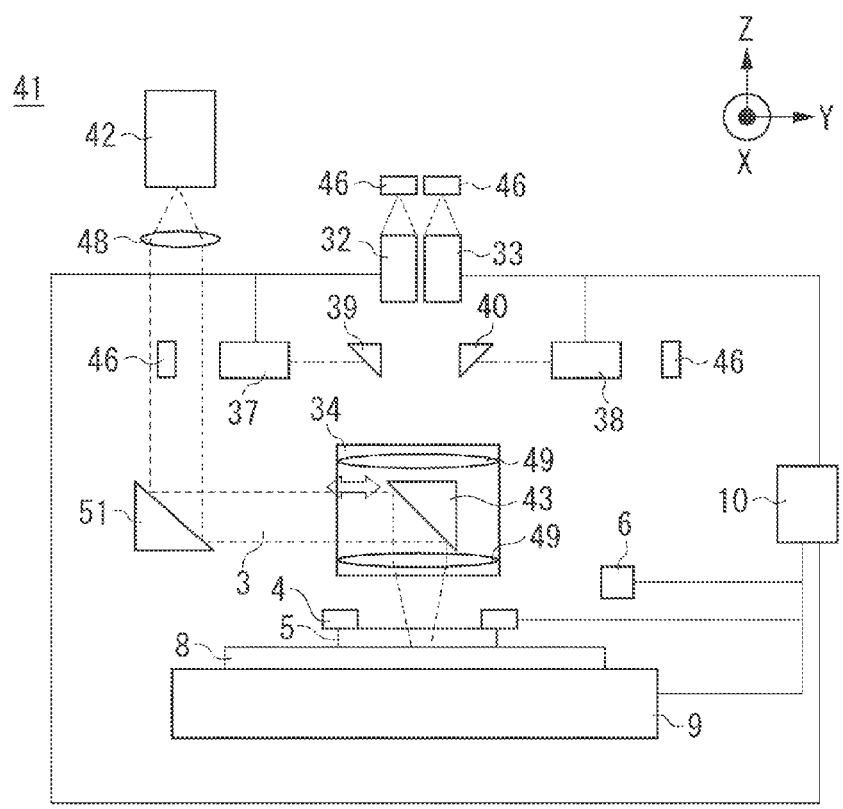
FIG. 6B schematically illustrates the imprint apparatus according to the sixth exemplary embodiment.
Figure 6C:
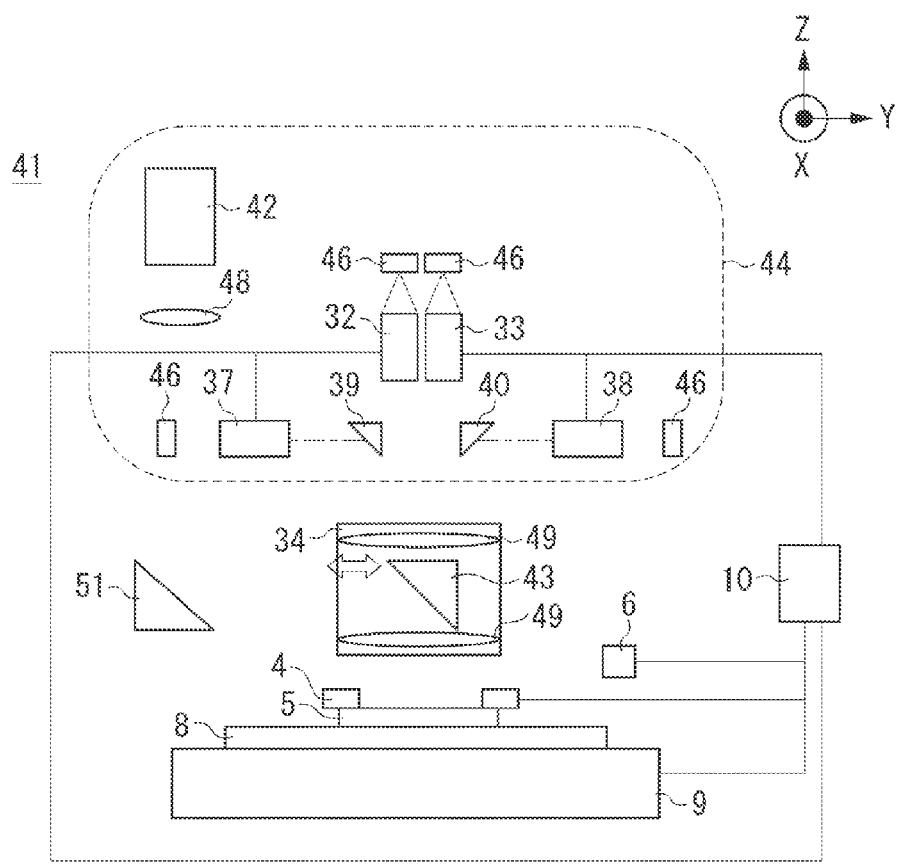
FIG. 6C schematically illustrates the imprint apparatus according to the sixth exemplary embodiment.

FIGS. 6A to 6C are block diagrams schematically illustrating an imprint apparatus 41 according to the sixth exemplary embodiment. The imprint apparatus 41 includes a plurality of TTM detection systems and is configured in such a manner that the illumination light from the illumination system is incident perpendicularly on the wafer 8. As illustrated in FIGS. 6A to 6C, the imprint apparatus 41 according to the sixth exemplary embodiment includes the wafer stage 9 configured to hold the wafer 8, the imprint head 4 configured to hold the mold 5, the resin coating mechanism 6, and the control unit 10. Further, the imprint apparatus 41 is configured with the TTM detection systems 32, 33, 37, and 38 (detection optical systems), like the imprint apparatus 36 illustrated in FIG. 5B.

FIG. 6A illustrates the imprint apparatus 41 during an alignment operation. During the alignment operation, the measurement light 11 emitted from the TTM detection systems 32, 33, 37, and 38 is transmitted through the relay optical system internal lens 49 provided in the relay optical system 34, and illuminate the mold 5 and the wafer 8. The reflected light from the alignment mark formed on the mold 5 and the alignment mark formed on the wafer 8 is transmitted through the relay optical system 34 and the TTM detection systems 32, 33, 37, and 38, and is then detected by the light-receiving elements 46 for the TTM detection systems 32, 33, 37, and 38. The mold 5 and the wafer 8 may be aligned with each other based on the detection signal. In this way, the optical path of the measurement light 11 during the alignment operation is not different from the optical path illustrated in FIG. 5B.

The relay optical system 34 may be configured similar to any of the relay optical systems 18, 23, 30, and 34 described in the descriptions of the preceding exemplary embodiments. The size of the screen of the relay optical system 34 (the area of the wafer surface to be imaged) may be determined to be any size as long as at least it enables images of a plurality of alignment marks formed on the substrate to be formed simultaneously.

In the example illustrated in FIGS. 6A to 6C, the mirrors 39 and 40, which bend the measurement light 11 and the reflected light, are arranged behind the imaging plane 47 of the relay optical system 34. However, as is the case with the fifth exemplary embodiment, the mirrors 39 and 40 may be arranged ahead of the imaging plane 47 or may be arranged at the imaging plane 47. It is possible to bend the light before the light effective diameter is increased by arranging the mirrors 39 and 40 near the imaging plane 47 in this way, and thereby it is possible to easily arrange a plurality of TTM detection systems.

In the imprint apparatus 41 according to the sixth exemplary embodiment, an illumination system 42 is arranged above the mold 5. When the wafer 8 is irradiated, as illustrated in FIG. 6B, a mirror 43 for the illumination system 42 is arranged in the relay optical system 34. The illumination light 3 emitted from the illumination system 42 is transmitted through a lens 48 for the illumination system 42, is bent by a bending mirror 51, and is guided to the mirror 43 arranged in the relay optical system 34. The illumination light 3 reflected by the mirror 43 is transmitted through the mold 5, and allow the imprint resin supplied on the wafer 8 to be irradiate. The imprint resin is cured by being irradiated with the illumination light 3.

FIG. 6C illustrates the imprint apparatus 41 with the plurality of TTM detection systems 32, 33, 37, and 38 and the illumination system 42 grouped as one unit 44 arranged above the mold 5. The sixth exemplary embodiment employs the method of providing the relay optical system 34 above the mold 5, and in this case, even a large unit, like the unit 44 constituted by the TTM detection systems 32, 33, 37, and 38, and the illumination system 42, may be collectively arranged above the mold 5. Providing the relay optical system 34 above the mold 5 allows the large unit 44 illustrated in FIG. 6C to be arranged above the mold 5, thereby enabling to realize highly accurate alignment with use of the TTM detection systems 32, 33, 37, and 38 each having a sufficiently large NA.

In the sixth exemplary embodiment, the insertion of the mirror 43 into the relay optical system 34 and the retraction of the mirror 43 from the relay optical system 34 allow the measurement light 11 and the illumination light 3 to selectively illuminate the mold 5 and the wafer 8. In the present exemplary embodiment, the mirror 43 may be replaced with any optical member capable of separating the illumination light 3 and the measurement light 11. For example, the relay optical system 34 may be replaced with the beam splitter described with reference to FIGS. 1 and 2. Use of the beam splitter eliminates the necessity of a drive mechanism (not illustrated) for moving the mirror 43.

According to the conventional art illustrated in FIG. 9, upper part of the mold 5 is extremely congested for the configurational reason, and therefore, only the TTM detection system 7 having the small NA 45 may be arranged above the mold 5. According to any of the above-described exemplary embodiments, the imprint apparatus may be configured with the TTM detection system having a large NA, and therefore may realize highly accurate alignment. Therefore, the imprint apparatus according to the above-described exemplary embodiments may highly accurately correct misalignment generated between the mold 5 and the wafer 8, and therefore may highly accurately align the mold 5 on the pattern on the foundation. Furthermore, this imprint apparatus may contribute to improvement of the yield rate of devices.

All of the preceding exemplary embodiments have been described based on an example in which the TTM detection system includes the light source, and illuminates the alignment marks with the measurement light. However, the TTM detection system does not necessarily have to include the light source. The imprint apparatus may include the light source (a measurement light illumination unit) for illuminating the alignment marks separately from the TTM detection system. The imprint apparatus may be configured in such a manner that the light emitted from the measurement light illumination unit illuminates the alignment marks, and the reflected light from the alignment marks is guided to the light-receiving element by the TTM detection system.

All of the preceding exemplary embodiments have been described based on an example in which the relay optical system forms an image of a whole shot. However, the relay optical system does not necessarily have to form an image of a whole shot. The relay optical system may form an image in any manner as long as a plurality of marks may be guided to the detection system simultaneously. Further, the imprint apparatus may employ a relay optical system that forms an image including a plurality of shot regions.

A device (for example, a semiconductor integrated circuit element, or a liquid crystal display element) manufacturing method includes forming a pattern on a substrate (a wafer, a glass plate, and a film-like substrate) with use of the above-described imprint apparatus. Further, the device manufacturing method may include performing etching on the substrate with the pattern formed thereon. If the device manufacturing method is to manufacture another product such as a patterned medium (recording medium) or an optical element, the device manufacturing method may include performing another processing on the substrate with the pattern formed thereon, instead of performing etching. The product manufacturing method according to the exemplary embodiments is advantageous compared to the conventional method in terms of at least one of the performance, quality, productivity, and manufacturing cost of the product.

While the embodiments have been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-110587 filed May 17, 2011, which is hereby incorporated by reference herein in its entirety.

What is claimed is:

1. An imprint apparatus configured to form a pattern to an imprint material on a substrate by using a mold, the imprint apparatus comprising:
   a light-receiving element;
   a detection system configured to guide light from a mark formed on the substrate and a mark formed on the mold to the light-receiving element; and
   a relay optical system,
   wherein the relay optical system is configured to form images of the light from the mark formed on the substrate and the mark formed on the mold between the relay optical system and the detection system, and
   wherein the detection system is configured to guide the light from the relay optical system to the light-receiving element.

2. The imprint apparatus according to claim 1, further comprising:
   an optical member, disposed in the relay optical system, configured to separate the light from the mark formed on the substrate and the mark formed on the mold, and the illumination light.

3. The imprint apparatus according to claim 2, further comprising:
   a light source included in the detection system configured to irradiate the mark formed on the substrate and the mark formed on the mold with light, and wherein a wavelength of the light from the light source and a wavelength of the illumination light are different from each other.

4. The imprint apparatus according to claim 3, wherein the illumination light is ultraviolet light and the light from the light source is visible light or infrared light.

5. The imprint apparatus according to claim 2, wherein the optical member reflects the illumination light emitted from the illumination system and transmits the light from the mark formed on the substrate and the mark formed on the mold.

6. The imprint apparatus according to claim 2, wherein the optical member transmits the illumination light emitted from the illumination system, and reflects the light from the mark formed on the substrate and the mark formed on the mold.

7. The imprint apparatus according to claim 1, further comprising an illumination system configured to emit illumination light for curing the imprint material,
wherein the illumination light is transmitted through the relay optical system, and the imprint material is irradiated with the illumination light.

8. The imprint apparatus according to claim 7, further comprising a switching mechanism configured to switch positions of the detection system and the illumination system,
wherein the switching mechanism is configured, when the light from the mark formed on the substrate and the mark formed on the mold is detected, to arrange the detection system in such a manner that the detection system guides the light from the relay optical system to the light-receiving element, and
wherein the switching mechanism is configured, when the imprint material is cured, to arrange the illumination system in such a manner that the illumination light illuminates the substrate via the relay optical system.

9. The imprint apparatus according to claim 1, further comprising:
an illumination system configured to emit illumination light for curing the imprint material;
a mirror configured to reflect the illumination light; and
a drive mechanism for moving the mirror,
wherein the drive mechanism is configured, when the imprint material is cured, to arrange the mirror by moving in the relay optical system.

10. The imprint apparatus according to claim 2, wherein a size of an area on the substrate to be image-formed by the relay optical system is equal to or larger than an illuminated area of the illumination light on the substrate.

11. The imprint apparatus according to claim 1, wherein the relay optical system is configured to be a telecentric optical system.

12. The imprint apparatus according to claim 1, wherein the detection system is configured to be movable, and guide the light from the mark formed on the substrate and the mark formed on the mold to the light-receiving element by moving.

13. The imprint apparatus according to claim 1, further comprising:
a plurality of pairs of the light-receiving element and the detection system,
wherein, by a detection system of a first pair among the plurality of pairs, a light from a first substrate mark formed on the substrate and from a first mold mark formed on the mold is led to the first pair of the light-receiving element, and
wherein, by a detection system of a second pair among the plurality of pairs, a light from a second substrate mark formed on the substrate and from a second mold mark formed on the mold is led to the second pair of the light-receiving element.

14. The imprint apparatus according to claim 13, further comprising a mirror at or near an imaging plane of the substrate that the relay optical system forms, wherein the mirror bends a part of a light flux of the light from the mark formed on the substrate and the mark formed on the mold.

15. An imprint method for transferring a pattern to an imprint material supplied on a substrate by using a mold having the pattern formed thereon, the imprint method comprising:
illuminating a mark formed on the substrate and a mark formed on the mold;
forming images of a light reflected from the mark formed on the substrate and the mark formed on the mold between an relay optical system and a detection system by the relay optical system;
guiding the light image-formed by the relay optical system to a light-receiving element by the detection system; and
detecting the mark formed on the substrate and the mark formed on the mold by the light-receiving element.

16. A device manufacturing method comprising:
forming a pattern on a substrate with use of an imprint apparatus; and
processing the substrate with the pattern formed thereon in the above-mentioned manner,
wherein the imprint apparatus configured to transfer a pattern to an imprint material supplied on a substrate by using a mold having the pattern formed thereon, the imprint apparatus comprising:
a light-receiving element;
a detection system configured to illuminate a mark formed on the substrate and a mark formed on the mold, and guide light reflected from the mark formed on the substrate and the mark formed on the mold to the light-receiving element; and
a relay optical system,
wherein the relay optical system is configured to form images of the light reflected from the mark formed on the substrate and the mark formed on the mold between the relay optical system and the detection system, and
wherein the detection system is configured to guide the light image-formed by the relay optical system to the light-receiving element.

17. The imprint apparatus according to claim 1, wherein a size of an area on the substrate to be image-formed by the relay optical system is larger than an area on the substrate to be image-formed by the relay optical system and the detection system.

18. An imprint apparatus configured to form a pattern to an imprint material on a substrate by using a mold, the imprint apparatus comprising:
a light-receiving element;
a relay optical system;
a detection system configured to guide light from a mark formed on the substrate and a mark formed on the mold to the light-receiving element; and
a moving unit configured to move the detection system along an imaging plane,
wherein the imaging plane of the substrate surface to be image-formed by the relay optical system is positioned between the relay optical system and the detection system.

19. An imprint apparatus configured to form a pattern to an imprint material on a substrate by using a mold, the imprint apparatus comprising:

a light-receiving element;
a relay optical system; and
a detection system configured to guide light from a mark formed on the substrate and a mark formed on the mold to the light-receiving element,
wherein the relay optical system forms images of light from a first substrate mark and a second substrate mark formed on the substrate and light from a first mold mark and a second mold mark formed on the mold, between the relay optical system and the detection system,
wherein the imprint apparatus includes a plurality of pairs of the light-receiving element and the detection system, and
wherein the light from the first substrate mark and the first mold mark is guided to a light-receiving element of a first pair among the plurality of pairs by a detection system of the first pair, and the light from the second substrate mark and the second mold mark is guided to a light-receiving element of a second pair among the plurality of pairs by a detection system of the second pair.

20. An imprint apparatus configured to form a pattern to an imprint material on a substrate by using a mold, the imprint apparatus comprising:
a light-receiving element;
a relay optical system;
a detection system configured to guide light from a mark formed on the substrate and a mark formed on the mold to the light-receiving element via the relay optical system;
an illumination system configured to emit illumination light for curing the imprint material; and
a moving unit configured to move the detection system along an imaging plane,
wherein the relay optical system includes an optical member that transmits either one of the light from a mark formed on the substrate and a mark formed on the mold or the emitted illumination light, and reflects the other light which is not transmitted, and
wherein the imaging plane of the substrate surface to be image-formed by the relay optical system is positioned between the relay optical system and the detection system.

21. An imprint apparatus configured to form a pattern to an imprint material on a substrate by using a mold, the imprint apparatus comprising:
a light-receiving element;
a relay optical system;
a detection system configured to guide light from a mark formed on the substrate and a mark formed on the mold to the light-receiving element via the relay optical system; and
an illumination system configured to emit illumination light for curing the imprint material,
wherein the relay optical system includes an optical member that transmits either one of the light from a mark formed on the substrate and a mark formed on the mold or the emitted illumination light, and reflects the other light which is not transmitted,
wherein the relay optical system forms images of light from a first substrate mark and a second substrate mark formed on the substrate and light from a first mold mark and a second mold mark formed on the mold, between the relay optical system and the detection system,
wherein the imprint apparatus includes a plurality of pairs of the light-receiving element and the detection system, and
wherein the light from the first substrate mark and the first mold mark is guided to a light-receiving element of a first pair among the plurality of pairs by a detection system of the first pair, and the light from the second substrate mark and the second mold mark is guided to a light-receiving element of a second pair among the plurality of pairs by a detection system of the second pair.

22. An imprint apparatus configured to form a pattern to an imprint material on a substrate by using a mold, the imprint apparatus comprising:
a light-receiving element;
an optical system;
a detection optical system configured to guide light from a mark formed on the substrate and a mark formed on the mold to the light-receiving element; and
wherein an imaging plane of the substrate surface to be image-formed by the optical system is positioned between the optical system and the detection optical system,
a moving unit configured to move the detection optical system along the imaging plane.

23. An imprint apparatus configured to form a pattern to an imprint material on a substrate by using a mold, the imprint apparatus comprising:
a light-receiving element;
an optical system; and
a detection optical system configured to guide light from a mark formed on the substrate and a mark formed on the mold to the light-receiving element,
wherein the optical system forms images of light from a first substrate mark formed on the substrate and a first mold mark formed on the mold, and light from a second substrate mark formed on the substrate and a second mold mark formed on the mold, between the optical system and the detection optical system,
wherein the imprint apparatus includes a plurality of pairs of the light-receiving element and the detection optical system, and
wherein the light from the first substrate mark and the first mold mark is guided to a light-receiving element of a first pair among the plurality of pairs by a detection optical system of the first pair, and the light from the second substrate mark and the second mold mark is guided to a light-receiving element of a second pair among the plurality of pairs by a detection optical system of the second pair.

24. An imprint apparatus configured to form a pattern to an imprint material on a substrate by using a mold, the imprint apparatus comprising: a light-receiving element; an optical system; a detection optical system configured to guide light from a mark formed on the substrate and a mark formed on the mold to the light-receiving element via the optical system; an illumination system configured to emit illumination light for curing the imprint material, wherein an imaging plane of the substrate surface to be image-formed by the optical system is positioned between the optical system and the detection optical system; and a moving unit configured to move the detection optical system along the imaging plane, wherein the optical system includes an optical member that transmits either one of the light from a mark formed on the substrate and a mark formed on the mold or the emitted illumination light, and reflects another light which is not transmitted.

25. An imprint apparatus configured to form a pattern to an imprint material on a substrate by using a mold, the imprint apparatus comprising: a light-receiving element; an optical system; a detection optical system configured to guide light from a mark formed on the substrate and a mark formed on the mold to the light-receiving element via the optical system; and an illumination system configured to emit illumination light for curing the imprint material, wherein the optical system includes an optical member that transmits either one of the light from a mark formed on the substrate and a mark formed on the mold or the emitted illumination light, and reflects another light which is not transmitted, wherein the optical system forms images of light from a first substrate mark formed on the substrate and a first mold mark formed on the mold, and light from a second substrate mark formed on the substrate and a second mold mark formed on the mold, between the optical system and the detection optical system, wherein the imprint apparatus includes a plurality of pairs of the light-receiving element and the detection optical system, and wherein the light from the first substrate mark and the first mold mark is guided to a light-receiving element of a first pair among the plurality of pairs by a detection optical system of the first pair, and the light from the second substrate mark and the second mold mark is guided to a light- receiving element of a second pair among the plurality of pairs by a detection optical system of the second pair.

\* \* \* \* \*